United States Patent [19]

Reese et al.

[11] Patent Number: 4,678,863
[45] Date of Patent: Jul. 7, 1987

[54] CORROSION RESISTANT CONDUCTIVE ELASTOMERS

[75] Inventors: Robert M. Reese, Philadelphia, Pa.; Norman R. Landry, Mount Laurel, N.J.

[73] Assignee: RCA Corporation, Princeton, N.J.

[21] Appl. No.: 749,271

[22] Filed: Jun. 27, 1985

[51] Int. Cl.⁴ .............................................. H05K 9/00
[52] U.S. Cl. .............................. 174/35 GC; 252/514; 439/88
[58] Field of Search ........... 174/35 GC; 219/10.55 D; 339/DIG. 3; 252/514; 427/433; 277/235 R

[56] References Cited

U.S. PATENT DOCUMENTS 3,140,342  7/1964  Ehrreich et al. .............. 174/35 GC
3,752,899  8/1973  Bakker .......................... 174/35 GC Primary Examiner—A. T. Grimley
Assistant Examiner—D. A. Tone
Attorney, Agent, or Firm—Joseph S. Tripoli; Robert L. Troike; Robert Ochis

[57] ABSTRACT

A corrosion resistant resilient electrically conductive gasket is comprised of a metal-containing conductive elastomer which has had any exposed metal coated with a protective conductive coating. The metal may be silver and the coating may be tin-lead solder applied by immersing the gasket into a molten solder bath.

14 Claims, 3 Drawing Figures

CORROSION RESISTANT CONDUCTIVE ELASTOMERS

BACKGROUND OF THE INVENTION

The present invention relates to the field of conductive elastomers.

Silver-containing conductive elastomers and especially silver-containing room temperature vulcanizing materials, generally known as RTVs, are used to control microwave currents for impedance matching at microwave frequencies, to shield against electromagnetic interference (EMI) and radio frequency interference (RFI) and to provide environmental seals in microwave and other electronic enclosures. The conductivity of these elastomers is provided by loading the elastomer with metal particles. The resilience of these elastomers can compensate for non-planar mating surfaces when they are used as gaskets between different portions of an enclosure to provide an environmental seal. At the same time, they provide a conductive path across the gap between the portions of an enclosure they are placed between.

Unfortunately, when silver-containing conductive elastomers are used directly against aluminum, corrosion of the aluminum results. Thus, the application of silver-containing conductive elastomer gaskets to aluminum bodies is considered a substantial reliability problem. To prevent such corrosion extraordinary measures must be taken. These measures can include coating the aluminum with silver loaded paints and epoxies, which are very expensive and whose application is labor intensive and therefore expensive as well. Another alternative is to plate the aluminum in the regions where the gasket will contact the aluminum. However, plating aluminum is in itself difficult, requires extensive surface preparation in order for the plating to properly adhere and also requires extensive masking to prevent plating portions of the aluminum where the plating is not desired. Thus, such plating is also a very labor intensive procedure. In addition, there are many instances where a gasket is required in a location where it is difficult or impossible to adequately plate or paint the mating surfaces of the aluminum. Tin-lead solder in contact with aluminum does not cause significant corrosion and is generally considered to be free of corrosion related reliability problems.

There is need for a conductive elastomer which is protected from causing corrosion of aluminum in contact therewith.

SUMMARY OF THE INVENTION

A corrosion resistant conductive elastomer is provided in the form of a body of metal-containing conductive elastomer having a protective conductive coating on any exposed metal on the surface of the elastomer. In one embodiment the metal within the elastomer is silver and its protective coating is solder. One method of providing such a corrosion resistant conductive elastomer comprises forming a silver-containing conductive elastomer preform and coating any silver which is exposed at the surface of the preform by immersing the preform in molten solder for a time sufficient to enable the solder to wet and coat that exposed silver.

DETAILED DESCRIPTION

Figure 1:
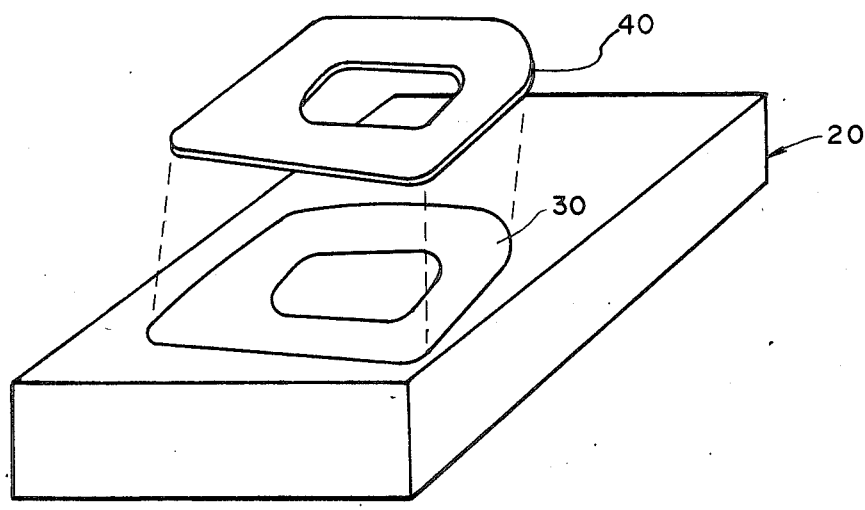
FIG. 1 is a perspective view of a gasket and a conductive housing on which it is to be placed.

In FIG. 1, one piece 20 of an enclosure has a surface region 30 where a conductive elastomer gasket 40 is to be placed in the process of assemblying an electronic system. For proper EMI/RFI shielding, the gasket 40 must be conductive. The use of silver-containing conductive elastomer for this gasket is considered desirable in order to minimize the electrical impedance of the gasket. In accordance with the prior art techniques discussed above, the surface region 30 of the aluminum housing 20 which would be contacted by the gasket 40 must either be painted with a silver loaded paint or epoxy or must be plated with a protective material in order to prevent the silver in the conductive elastomer from causing corrosion of the surface region 30 of the aluminum.

Figure 2:
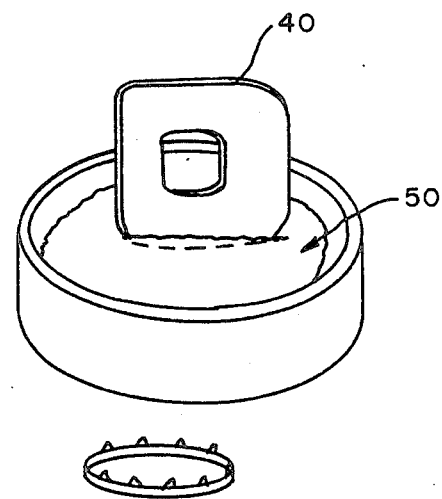
FIG. 2 illustrates one way of producing a gasket in accordance with the present invention.

In accordance with the present invention the need to apply a protective coating (by painting or plating) is eliminated through use of an improved gasket 40. The improved gasket comprises a metal particle containing conductive elastomer preform which has been provided with a protective coating over any of its metal which is exposed at its surface. In a preferred embodiment these metal particles contain silver. The preform may be cut from a cured sheet of the elastomer or may be molded from an uncured form of the elastomer. The protective coating may preferably be applied by immersing the preform 40 into a molten solder bath 50 (as shown in FIG. 2) for a period of time which is sufficient to enable the solder to wet and coat any exposed portions of the silver. The duration for which the preform 40 must be immersed in the solder bath is a function of the size of the gasket and its heat capacity. For an elastomer gasket having a thickness of 0.020 inches (0.05 centimeter) and a surface area of about 1 square inch (6.45 square centimeters) an immersion time of about eight seconds in a solder bath is generally sufficient to raise the temperature of the entire preform to a level at which the solder wets and coats the exposed silver. Too short an immersion time can result in the failure to coat the exposed silver or the coating of the exposed silver with a cold solder joint in which the solder does not adhere well to the silver.

Figure 3:
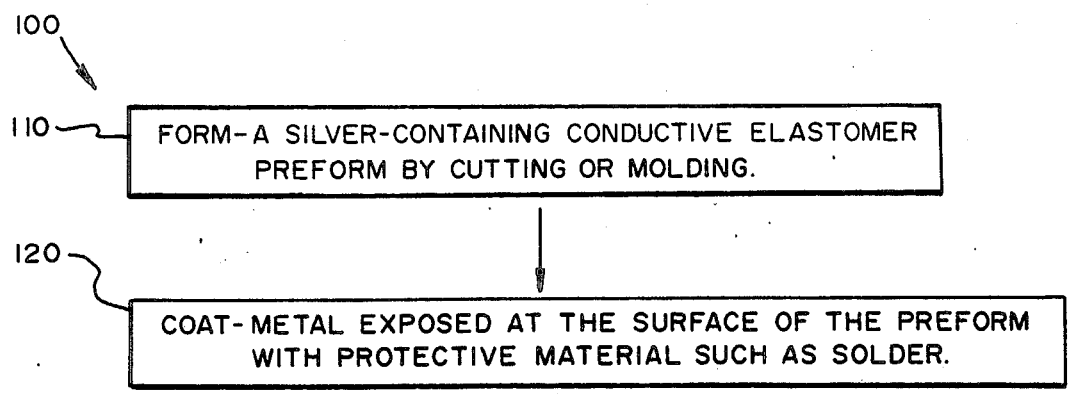
FIG. 3 illustrates one process for providing a corrosion resistant silver-containing conductive elastomer in accordance with the present invention.

As illustrated in FIG. 3, a process 100 for producing such a corrosion resistant gasket comprises a forming step 110 and a coating step 120. In step 110 a silver-containing conductive elastomer preform is formed in the desired configuration of the gasket. This forming may comprise cutting a gasket from a cured elastomer sheet or molding the preform. In step 120 any exposed silver in that preform is coated with a protective material. The preferred protective material for use with aluminum is solder, which is applied by dipping the preform into a molten solder bath for a sufficient period to enable the solder to wet and adhere to any exposed silver.

In the case of a gasket cut from a cured sheet of conductive elastomer it is preferred to coat the gasket after cutting to ensure protection of the metal particles exposed in the newly cut surface.

To produce a molded preform, a liquid source material which upon molding converts to the desired solid filled elastomer is introduced into the mold and allowed to cure or set in accordance with its composition. This source material will normally be a liquid unconverted polymer loaded with metal particles and may include a catalyst or curing agent as is appropriate to its composition.

When the use of silver-containing conductive elastomer gaskets in accordance with this invention with aluminum structures was proposed, a quality assurance test was devised to establish that it solved the reliability problems associated with the use of such gaskets against aluminum. The test specified a 100 hour salt spray exposure in accordance with the standard MIL-C-5541C using a 5% salt concentration for the spray solution.

The effectiveness of the present inventive gasket was established in the above comparison test in which the elastomer Cho-Seal 1215 available from Chomerics, Woburn, Mass., 01801 was used. Three different aluminum/gasket combinations were processed simultaneously in an identical manner in the above corrosion qualification test. Each test sample comprised four 1 inch square gaskets spaced apart on an iridited aluminum plate with another iridited aluminum plate over the gaskets and clamped to simulate two pieces of an aluminum enclosure. In two of the samples the gaskets were cut from 0.020 inch (0.05 centimeter) thick sheet stock of the Cho-Seal 1215. The gaskets in the first test sample consisted of these gaskets in as-cut (uncoated) condition. The gaskets in the second test sample consisted of such gasket squares in which exposed silver had been coated (after cutting) in accordance with the above described process by immersion of the gaskets in molten solder. The gaskets in the third test sample consisted of one-inch square tin-lead plates. The three samples were put through the above specified test.

At the completion of this 100 hour test, the aluminum plates in the sample consisting of uncoated gaskets were heavy pitted. The degree of corrosion (pitting) was sufficient to destroy the ability of such gaskets to control microwave currents and to provide environmental and EMI/RFI seals. The aluminum plates in the sample having gaskets in accordance with the present invention, showed only very minimal signs of corrosion. The aluminum plates in the samples in which the tin-lead plates were used showed greater corrosion than in the sample whose gaskets were in accordance with the present invention but substantially less corrosion than in the sample in which the uncoated gaskets were used. These test results led to approval of solder-coated silver-containing conductive elastomers for use in contact with aluminum even in salt environments.

From the results of this test it is apparent that prior to coating the elastomer with solder, some of the silver within the elastomer must be exposed at its surface. This is consistent with the fact that many silver-containing conductive elastomer have very low resistances even at DC since exposed conductive material is necessary to provide low DC resistance. This invention protects aluminum from contact with that silver by coating that silver with tin-lead solder which does not induce corrosion of aluminum.

It will be recognized, that although dipping of the final gasket in molten solder provides a coated gasket which prevents corrosion of aluminum in contact therewith, other coating techniques may be utilized. These include electroless plating of the exposed silver in such a gasket. Materials other than tin-lead solder may be used as the coating material in accordance with the composition of the structural material which will be in contact with the finished gasket. Conductive elastomers whose conductive material is other than silver may be treated in a similar way to coat their conductive materials.

In this specification gaskets in accordance with this invention are referred to in several places as "coated gaskets". It will be understood that this is a shorthand way of saying "gaskets whose exposed metal is coated".

What is claimed is:

1. A corrosion resistant resilient electrically conductive member comprising:
a body of a conductive elastomer containing metal particles which contain silver; and
a protective conductive coating on any of said silver-containing metal particles which are exposed at the surface of said body.

2. The resilient conductive member recited in claim 1 wherein:
said body is cut from a cured sheet of said elastomer.

3. The resilient conductive member recited in claim 1 wherein:
said body is molded from an uncured elastomer.

4. The resilient conductive member recited in claim 5 wherein:
said protective coating is solder.

5. A method of producing a corrosion resistant resilient electrically conductive member comprising:
forming a silver-containing conductive elastomer preform;
coating any silver which is exposed on the surface of said preform with a protective conductive material to protect said silver from corrosion-producing contact with other metals.

6. The method recited in claim 5 wherein said coating step comprises dipping said preform into molten solder for a sufficient time to enable said solder to wet and adhere to any exposed metal.

7. The method recited in claim 6 wherein said solder is a tin-lead solder.

8. The method recited in claim 5 wherein said forming step comprises cutting said preform from a sheet of said elastomer.

9. The method recited in claim 5 wherein said forming step comprises molding said preform from a liquid source material.

10. A method of producing a corrosion resistant resilient electrically conductive member comprising:
forming a silver-containing conductive elastomer preform;
coating any silver which is exposed on the surface of said preform with a protective conductive material to protect said silver from corrosion-producing contact with other metals by immersing said preform in molten solder for a time which is sufficient to enable said solder to wet and coat any exposed silver.

11. The method recited in claim 10 wherein said solder is a tin-lead solder.

12. The method recited in claim 10 wherein said forming step comprises cutting said preform from a sheet of said elastomer.

13. The method recited in claim 10 wherein said forming step comprises molding said preform from a liquid, silver-containing, source material.

14. The method recited in claim 10 wherein said coating step comprises immersing said preform in said molten solder for at least substantially eight seconds.

* * * * *

UNITED STATES PATENT AND TRADEMARK OFFICE
CERTIFICATE OF CORRECTION

PATENT NO. : 4,678,863

DATED : July 7, 1987

INVENTOR(S) : Robert M. Reese et al.

It is certified that error appears in the above-identified patent and that said Letters Patent is hereby corrected as shown below:

Column 4, line 24, "claim 5" should be --claim 1--.

Signed and Sealed this

Twentieth Day of October, 1987

Attest:

DONALD J. QUIGG

*Attesting Officer*　　　　*Commissioner of Patents and Trademarks*